United States Patent
An et al.

(10) Patent No.: US 8,209,860 B2
(45) Date of Patent: Jul. 3, 2012

(54) METHOD OF MANUFACTURING PRINTED CIRCUIT BOARD HAVING METAL BUMP

(75) Inventors: Jin Yong An, Gyunggi-do (KR); Seok Kyu Lee, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 242 days.

(21) Appl. No.: 12/552,957

(22) Filed: Sep. 2, 2009

(65) Prior Publication Data

US 2011/0000083 A1    Jan. 6, 2011

(30) Foreign Application Priority Data

Jul. 3, 2009 (KR) .................. 10-2009-0060698

(51) Int. Cl.
*H01R 9/00* (2006.01)

(52) U.S. Cl. .............. 29/842; 29/830; 29/840; 29/852; 428/209

(58) Field of Classification Search ............. 29/832, 29/830, 840, 852, 842; 428/209
See application file for complete search history.

(56) References Cited

U.S. PATENT DOCUMENTS 5,822,856 A * 10/1998 Bhatt et al. ............... 29/832

* cited by examiner

*Primary Examiner* — Carl Arbes
(74) *Attorney, Agent, or Firm* — Blakely Sokoloff Taylor & Zafman LLP

(57) ABSTRACT

Disclosed herein are a printed circuit board having metal bumps which have uniform diameter and are formed at fine pitch, and a method of manufacturing the printed circuit board.

8 Claims, 8 Drawing Sheets

US 8,209,860 B2

METHOD OF MANUFACTURING PRINTED CIRCUIT BOARD HAVING METAL BUMP

CROSS REFERENCE TO RELATED APPLICATION(S)

This application claims the benefit of Korean Patent Application No. 10-2009-0060698, filed on Jul. 3, 2009, entitled "A METHOD OF MANUFACTURING A PRINTED CIRCUIT BOARD COMPRISING A METAL BUMP", which is hereby incorporated by reference in its entirety into this application.

BACKGROUND OF THE INVENTION

1. Technical Field

The present invention relates to a method of manufacturing a printed circuit board having metal bumps.

2. Description of the Related Art

With the recent advancement of the electronics industry, electronic components are being developed to have high performance and thus there is a demand for miniaturized and highly-densified packages. Accordingly, interposers (substrates) which function to connect ICs to a main board must be more densely packed. The high densification of packages is attributable to an increase of the number of I/Os of the ICs, and the method of connection made with the interposers has also been made more efficient. As methods of mounting ICs on a board to manufacture a high density package, a wire bonding process or a flip bonding process are currently being used. In this regard, as the number of I/Os is increased above a certain number, the flip bonding process is preferably used because of the increase in the manufacturing costs.

In order to perform the flip chip bonding process, the formation of solder balls is required. According to a conventional method, the solder balls are formed through a printing process of solder paste using screen printing and a reflow process.

However, the method of forming bumps of a printed circuit board using a printing technique is problematic in that it requires wide connecting pads, so that it is difficult to realize bumps having fine pitch of 120 μm or less.

Further, the method of forming the bumps using the printing technique is problematic in that it is difficult to form bumps at fine pitch, or their volume is excessively decreased even if the bumps are formed.

Since the connecting pads are formed using a plating technique, the connecting pads may vary in thickness because of errors in plating, and it is hard to evenly distribute the amount of solder paste used when printing it during the printing process, so that the height of the solder balls is not uniform, and thus solder balls which are not connected to a semiconductor chip may be found.

Furthermore, since the height difference between a solder resist and the pads is large, voids may undesirably occur during an underfill process subsequent to the mounting of electronic components.

SUMMARY OF THE INVENTION

The present invention has been made in an effort to provide a method of manufacturing a printed circuit board having metal bumps which have fine pitch and are of uniform diameter and height.

A method of manufacturing a printed circuit board having a metal bump according to an embodiment of the present invention includes (A) placing a metal foil on a carrier, (B) applying a dry film and patterning a hole for the metal bump, (C) forming a metal bump charged in the hole and an upper circuit layer including a connecting pad provided on the dry film, (D) forming an insulating layer on the dry film, (E) forming a buildup layer including a lower circuit layer on the insulating layer, (F) removing the carrier, and (G) removing the dry film.

A polymer-based release layer may be applied to each of opposite sides of a rigid substrate of the carrier.

The carrier may be made of a polymer-based release material.

The metal foil may be made of nickel (Ni) or aluminum (Al).

The method may include forming the metal bump and the upper circuit layer including the connecting pad by electrolytic plating the metal foil using a lead-in wire.

The insulating layer may comprise a prepreg or Ajinomoto Build up Film (ABF).

The method may further include, after (E) forming the buildup layer, forming a solder resist layer on the lower circuit layer.

(F) removing the carrier may include (i) separating the metal foil from the carrier, and (ii) removing the metal foil from the dry film.

DESCRIPTION OF THE PREFERRED EMBODIMENTS

Figure 1:
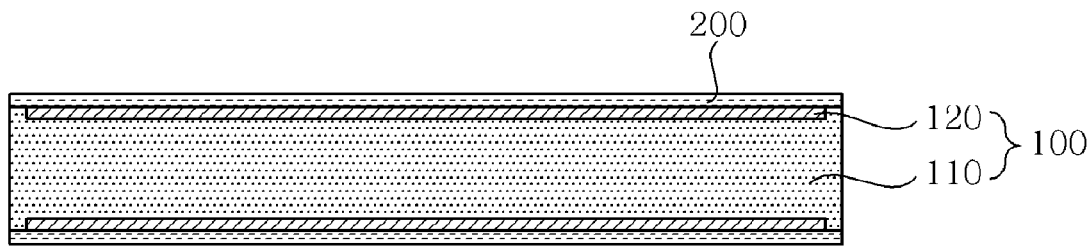
FIGS. 1 to 9 are cross-sectional views sequentially showing a method of manufacturing a printed circuit board having metal bumps, according to an embodiment of the present invention.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

Hereinafter, a printed circuit board having metal bumps and a manufacturing method thereof according to the present invention will be described in detail with reference to the accompanying drawings. Throughout the accompanying drawings, the same reference numerals are used to designate the same or similar components, and redundant descriptions thereof are omitted. In the following description, the terms "upper", "lower" and the like are used to differentiate a certain component from other components, but the configuration of such components should not be construed to be limited by the terms.

Figure 9:
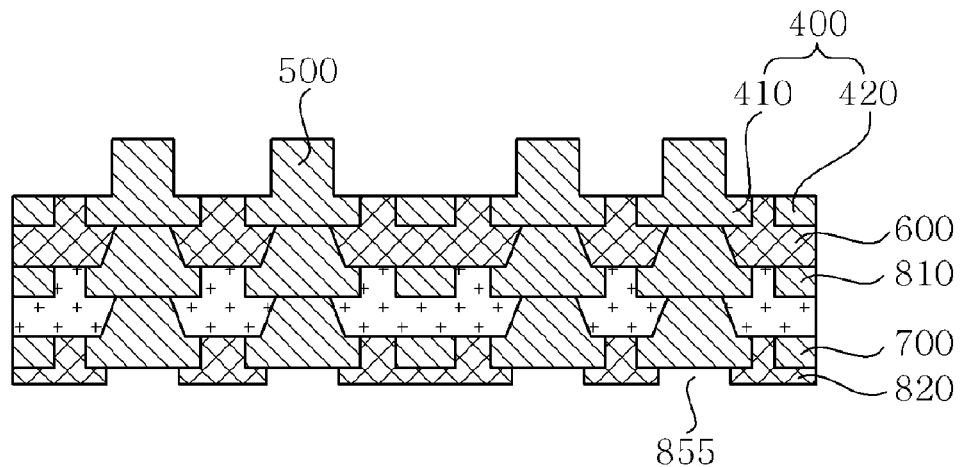

FIG. 9 is a cross-sectional view showing a printed circuit board having metal bumps, according to an embodiment of the present invention. As shown in the drawing, the printed circuit board according to this embodiment includes an upper circuit layer 400 including connecting pads 410 which are made of electroconductive metal and embedded in an upper portion of an insulating layer 600, and metal bumps 500 which are integrated with the connecting pads 410 in such a way as to protrude upwards from the connecting pads 410. The metal bumps 500 of uniform diameter protrude upwards from the insulating layer 600.

The insulating layer 600 may be a solder resist layer or may be made of complex polymer resin that is an interlayer insulating material. For example, a prepreg may be applied to the insulating layer 600 so as to manufacture a thinner printed circuit board. Further, ABF (Ajinomoto Build up Film) may be applied to the insulating layer 600 so as to easily realize a fine circuit. In addition, the insulating layer 600 may use epoxy-based resin such as FR-4, BT (Bismaleimide Triazine), but is not particularly limited thereto.

The metal bumps 500 protrude upwards from the insulating layer 600, and function to electrically connect electronic components, which are to be mounted on the printed circuit board, to a wiring layer formed on the printed circuit board. The metal bumps 500 are integrally formed with the connecting pads 410 which are embedded into the upper portion of the insulating layer 600, and are made of the same material as the connecting pads 410. Thus, although the metal bumps 500 are not clearly distinguished from the connecting pads 410, a portion which has a smaller diameter than each connecting pad 410 and is higher than other portions of the connecting pad 410 is designated as the metal bump 500. According to this embodiment, the metal bump 500 has the shape of a post which is formed such that upper and lower portions thereof are of uniform diameter. In this regard, the term "uniform" does not mean that the diameter of the upper portion of the metal bump 500 is mathematically completely identical with that of the lower portion of the metal bump 500, because it includes slight variation in diameter due to errors which may occurs in a substrate manufacturing process.

The upper circuit layer 400 includes the connecting pads 410 which are embedded into the upper portion of the insulating layer 600 and connected to the metal bumps 500. According to this embodiment, each connecting pad 410 is embedded into the insulating layer 600 and includes a surface which is exposed outside the insulating layer 600. In this regard, the exposed surface means a surface which is not covered by the insulating layer 600 into which the connecting pads 410 are embedded, but does not mean a surface which is exposed through another insulating layer that may be formed outside the insulating layer 600 or through a solder resist layer. Preferably, the exposed surface of each connecting pad 410 corresponds to a surface of the insulating layer 600. The connecting pads 410 may be made of electroconductive metal, for example, gold, silver, copper, or nickel.

Meanwhile, only the upper structure of the printed circuit board which is a characteristic part of this embodiment has been described hereinbefore. However, the printed circuit board according to this embodiment further includes a buildup layer 800 which is placed under the insulating layer 600 and has a lower circuit layer 700 electrically connected to the upper circuit layer 400. The buildup layer 800 may further include an inner circuit layer 810 (see FIG. 5) between the upper circuit layer 400 and the lower circuit layer 700. In this embodiment, a single inner circuit layer 810 is provided. But, the number of inner circuit layers 810 is not limited to one. Those skilled in the art can easily understand that the number of inner circuit layers 810 is adjustable, if necessary.

The lower circuit layer 700 may include lower metal bumps. In addition, the lower circuit layer 700 may also include a solder resist layer 820 which covers the lower circuit layer 700 and has openings 855 to expose the lower metal bumps 500 to the outside.

Since the above-mentioned printed circuit board includes the metal bumps 500 of the post shape which have good electric transmission properties, electric connection with the electronic components mounted on the printed circuit board is good.

Further, each metal bump 500 is not shaped such that its lower portion has a larger diameter than its upper portion but is shaped to be of uniform diameter, thus enabling the metal bumps 500 to have fine pitch.

The insulating layer 600 corresponds to the upper surface of the connecting pad 410, so that there is no height difference between the insulating layer 600 and the connecting pad 410, and thus voids do not occur during an underfill process.

FIGS. 1 to 9 are cross-sectional views sequentially showing a method of manufacturing the printed circuit board having the metal bumps, according to an embodiment of the present invention. The manufacturing process of the printed circuit board having the metal bumps according to this embodiment will be described below with reference to the drawings.

In this embodiment, a process of placing the printed circuit board on only one side of a carrier 100 will be described. However, it is possible to simultaneously place printed circuit boards on both sides of the carrier 100.

First, a step of placing a metal foil 200 on the carrier 100 is conducted. As shown in FIG. 1, in order to prevent the printed circuit board from being bent during the manufacturing process, the carrier 100 serving as a support is prepared. The carrier 100 preferably includes a rigid substrate 110 and a polymer-based release layer 120 which is formed on the rigid substrate 110. The release layer 120 may be formed through thin film coating or sputtering using a polymer-based material. Preferably, the carrier 100 has a thickness of from about 100 to 800 μm.

Preferably, the release layer 120 has a shorter length and a smaller area than the rigid substrate 110 and is formed on the upper portion of the rigid substrate 110 except both side ends of the rigid substrate 110. This allows the metal foil 200 to be easily separated from the carrier 100 in the latter part of the manufacturing process of the printed circuit board. The metal foil 200 is placed on the carrier 100 and constrained by a portion of the rigid substrate 110 having no release layer 120. Preferably, the metal foil 200 is made of nickel (Ni) or aluminum (Al).

Figure 2:
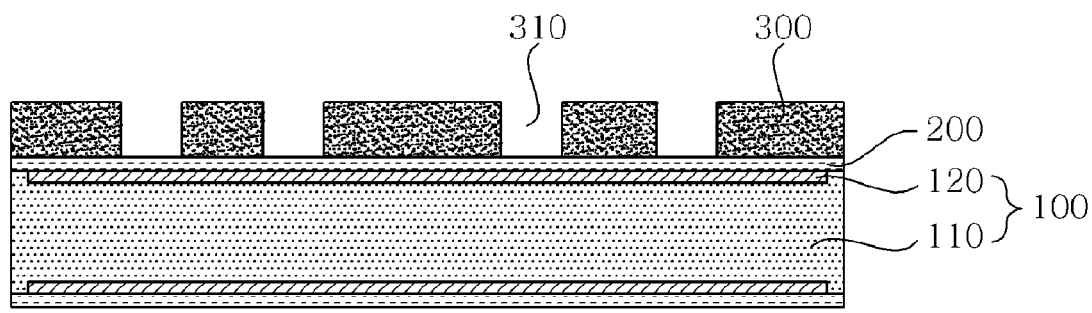

Next, as shown in FIG. 2, a step of applying a dry film 300 and of patterning holes 310 for the metal bumps is performed. The dry film 300 is applied onto the carrier 100 and the holes 310 for forming the metal bumps 500 are patterned. Preferably, the dry film 300 is a photosensitive dry film. The dry film 300 is applied and is selectively exposed and cured using a mask (not shown) having a light blocking pattern after which the uncured portion is removed. Thereby, the holes are patterned.

Figure 3:
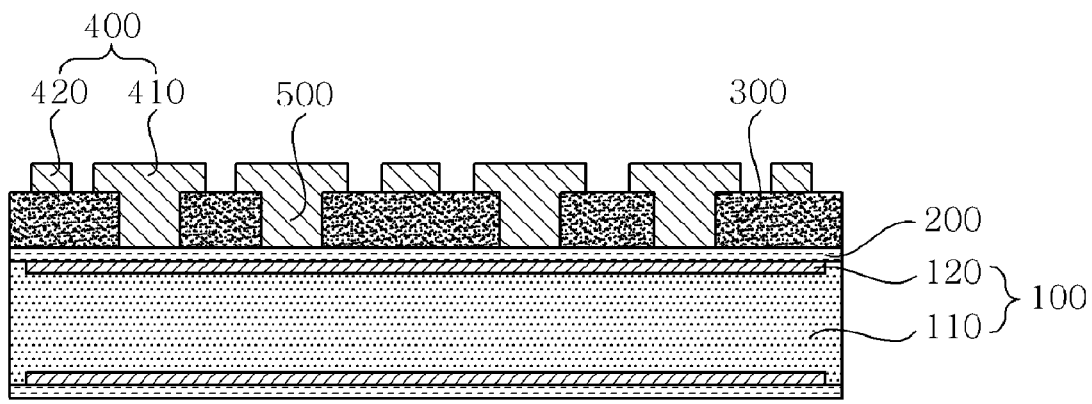

Subsequently, as shown in FIG. 3, a step of forming the metal bumps 500 charged in the holes 310 and the upper circuit layer 400 including the connecting pads 410 provided on the dry film 300 is conducted. Preferably, a plating resist (not shown) made of a photosensitive material is applied, and an opening for forming the upper circuit layer 400 including openings for the creation of the connecting pads 410 which are used to expose the holes 310 is patterned. Thereafter, by electrolytic plating the metal foil 200 using a lead-in wire, the metal bumps 500 and the upper circuit layer 400 including the connecting pads 410 is formed. Here, it can be easily understood that the upper circuit layer 400 may selectively include a circuit pattern 420 and the presence of the circuit pattern 420 may be determined according to the patterning shape of the plating resist.

The holes 310 of the dry film 300 patterned through exposing and developing have uniform diameter. Since the metal bumps 500 are formed using the holes 310, the metal bumps 500 of the post shape which are of uniform diameter and are not tapered may be formed. Of course, the phrase "uniform diameter" does not mean that the diameter of the upper portion of the metal bump 500 is mathematically completely identical with that of the lower portion of the metal bump 500, but includes slight variation in diameter due to errors which may occur in a substrate manufacturing process. Further, it can be understood that each metal bump 500 is formed to have a height corresponding to the thickness of the dry film 300.

Figure 4:
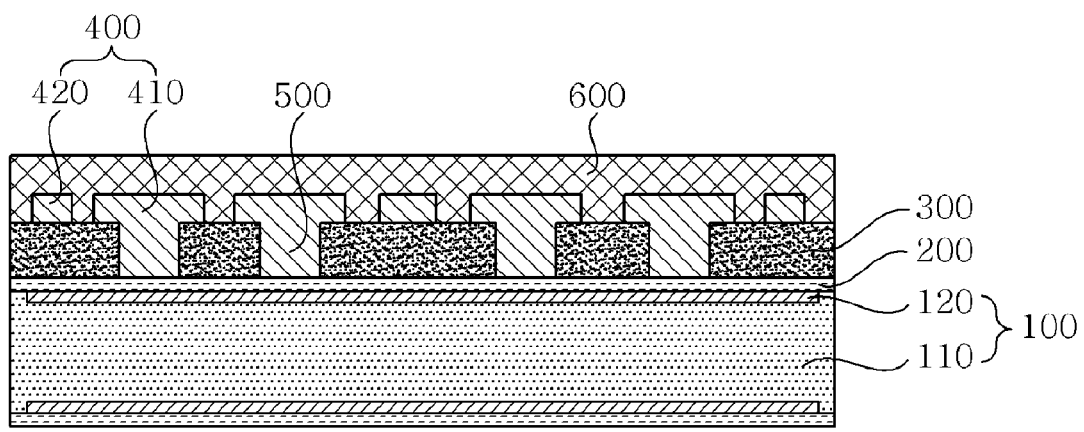

Subsequently, as shown in FIG. 4, a step of forming the insulating layer 600 on the dry film 300 is conducted. The insulating layer 600 may be a solder resist layer or be made of complex polymer resin that is an interlayer insulating material. For example, a prepreg may be applied to the insulating layer 600 so as to manufacture a thinner printed circuit board. Further, ABF (Ajinomoto Build up Film) may be applied to the insulating layer 600 so as to easily realize a fine circuit. In addition, the insulating layer 600 may use epoxy-based resin such as FR-4, BT (Bismaleimide Triazine), but is not particularly limited thereto.

Figure 5:
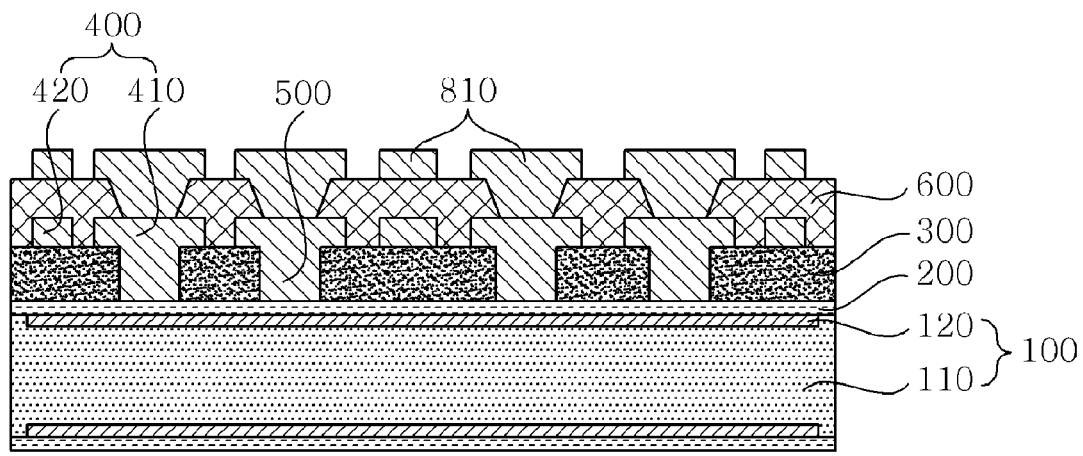
Figure 6:
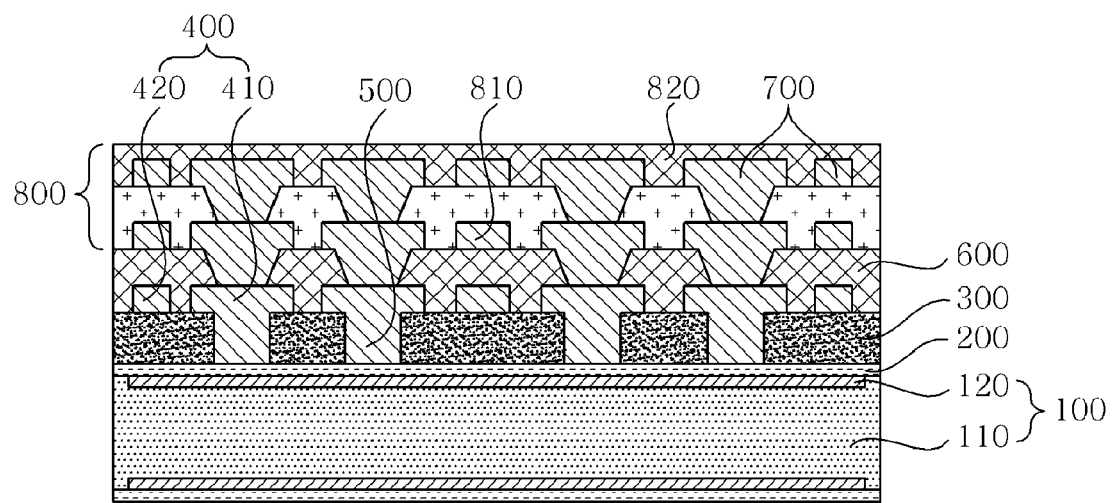

Next, as shown in FIGS. 5 and 6, a step of forming the buildup layer 800, including the lower circuit layer 700, on the insulating layer 600 is conducted. The insulating layer 600 is perforated to form via holes using a YAG laser or $CO_2$ laser drill. Subsequently, the inner circuit layer 810 is formed through a semi-additive process, and the same process is repeated, thus forming the lower circuit layer 700. In this embodiment, the buildup process including a single inner circuit layer 810 is described. However, the number of inner circuit layers 810 is not limited to one, and besides, a construction having no inner circuit layer is possible. After the lower circuit layer 700 has been finished, the solder resist layer 820 is formed on the lower circuit layer 700 to cover the lower circuit layer 700.

Figure 7:
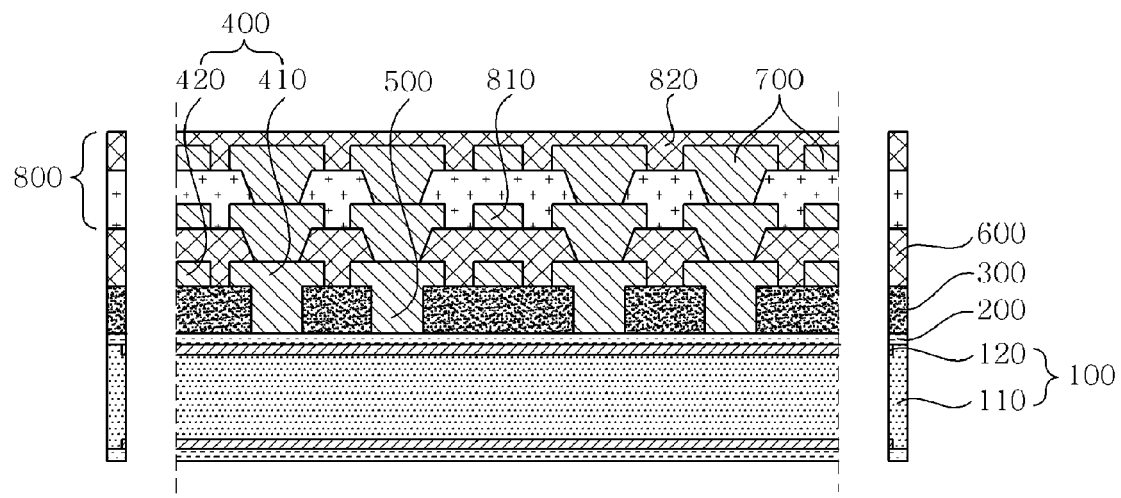

Thereafter, as shown in FIG. 7, a step of removing the carrier 100 is conducted. The sides of the carrier 100 and the printed circuit board placed on the carrier 100 are cut using a routing process, so that the metal foil 200 can be separated from the carrier 100. In this regard, the routing process is a process of mechanically cutting using a routing bit. By cutting and removing the sides of the printed circuit board and the carrier 100, the portion of the rigid substrate 110 constraining the metal foil 200 placed on the carrier 100 is eliminated, so that the metal foil 200 and the printed circuit board are separated from the carrier 100. Subsequently, an etching process is performed to remove the metal foil 200 from the dry film 300.

Figure 8:
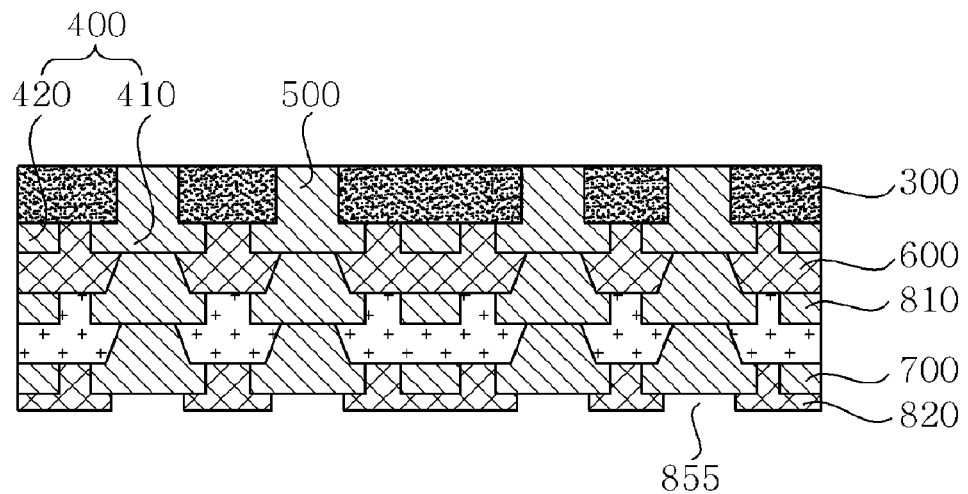

Next, as shown in FIG. 8, openings 855 are formed in the solder resist layer 820 to expose the lower metal bumps formed on the lower circuit layer 700.

Thereafter, as shown in FIG. 9, the dry film 300 is removed using stripping liquid.

Next, a surface protective layer may be formed on the exposed surfaces of the metal bump 500 and the connecting pads 410. For example, the surface protective layer may be formed through OSP treatment or by nickel or gold plating.

In the manufacturing process of the printed circuit board, the dry film 300 is placed on the carrier 100, and then the metal bumps 500 are formed using the dry film 300 placed on the carrier 100, thus being capable of manufacturing the printed circuit board having the metal bumps 500 of the post shape which have uniform height and good electrical transmission properties.

Further, since the metal bumps 500 are formed by charging the holes 310 of uniform diameter formed in the dry film 300 through plating, the metal bumps 500 of uniform diameter can be formed and thus the bumps 500 can be formed at fine pitch.

FIGS. 10 to 18 are cross-sectional views sequentially showing a method of manufacturing a printed circuit board having metal bumps, according to another embodiment of the present invention. The manufacturing process of the printed circuit board having the metal bumps according to this embodiment will be described below with reference to the accompanying drawings. The duplicate description of the above-mentioned embodiment will be omitted herein.

Figure 10:
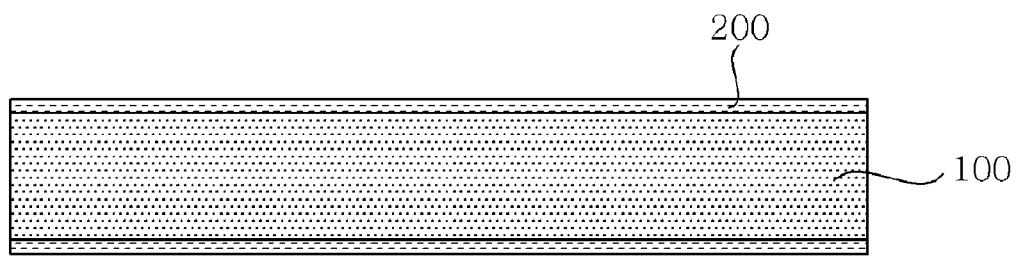
FIGS. 10 to 18 are cross-sectional views sequentially showing a method of manufacturing a printed circuit board having metal bumps, according to another embodiment of the present invention.

First, a step of placing a metal foil 200 on a carrier 100 is conducted. As shown in FIG. 10, the carrier 100 is prepared and the metal foil 200 is placed on the carrier 100. The carrier 100 is preferably a polymer-based release material. Since the carrier 100 is made of the release material, it is preferable that surface treatment be conducted so as to enhance adhesive force between the carrier 100 and the metal foil 200. In this regard, the surface treatment may use Si coating or plasma treatment. The surface treatment is preferably performed such that the upper portion of the carrier 100 displays a hydrophilic property.

Figure 11:
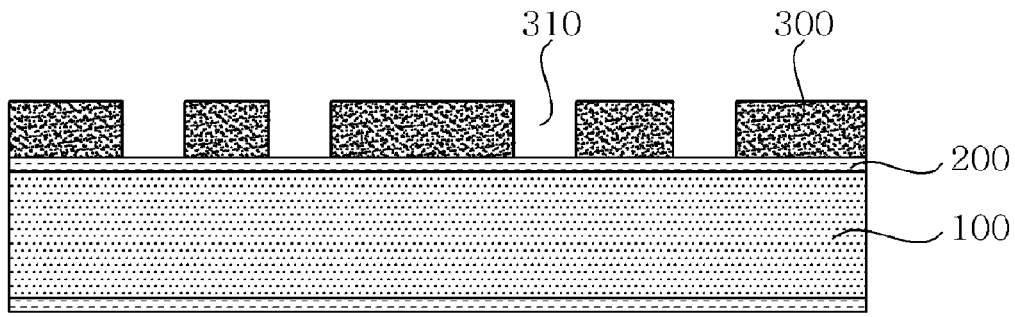

Next, as shown in FIG. 11, a step of applying a dry film 300 and of patterning holes 310 for the metal bumps is performed.

Figure 12:
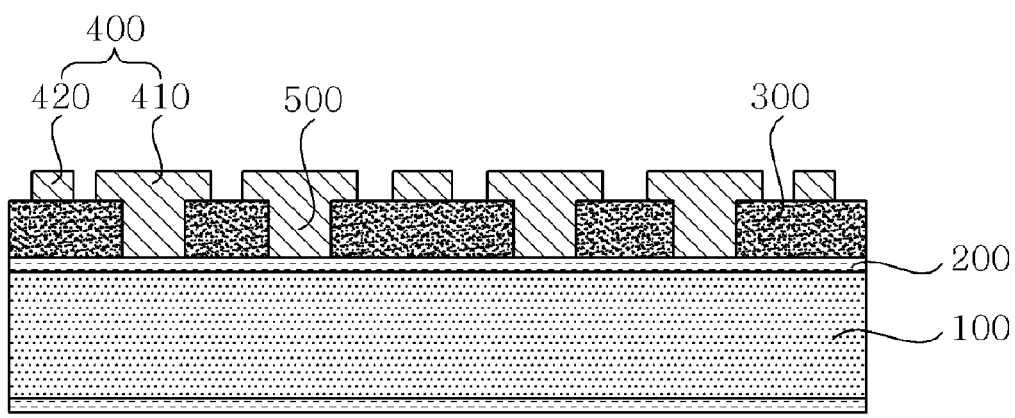

Subsequently, as shown in FIG. 12, a step of forming the metal bumps 500 charged in the holes 310 and an upper circuit layer 400 including the connecting pads 410 provided on the dry film 300 is conducted.

Figure 13:
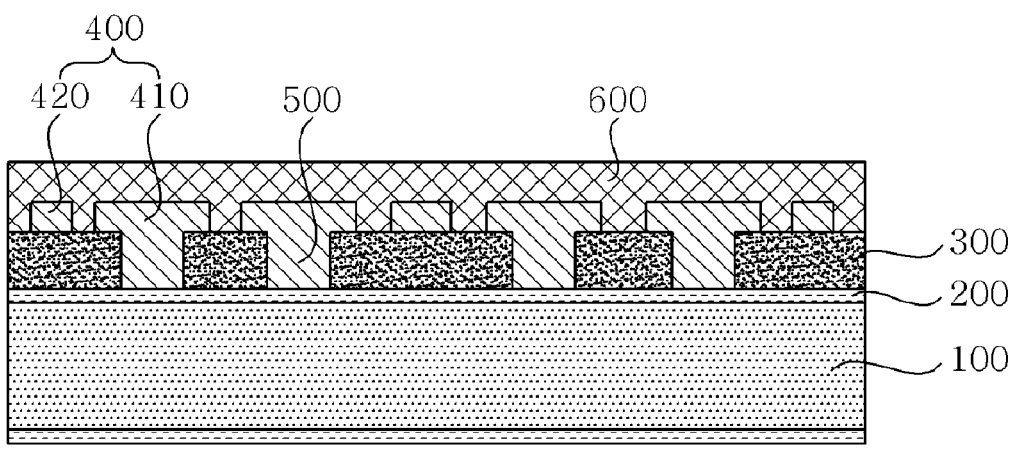

Thereafter, as shown in FIG. 13, a step of forming an insulating layer 600 on the dry film 300 is conducted.

Figure 14:
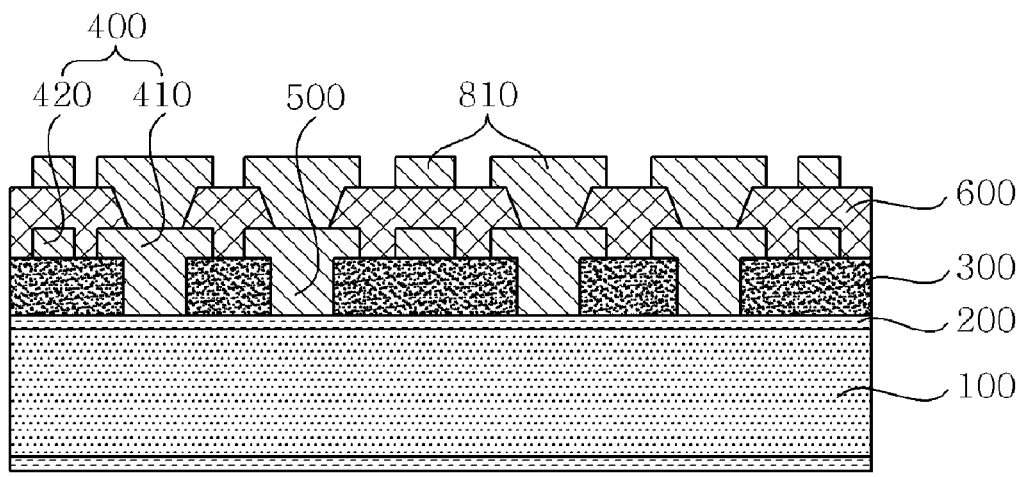
Figure 15:
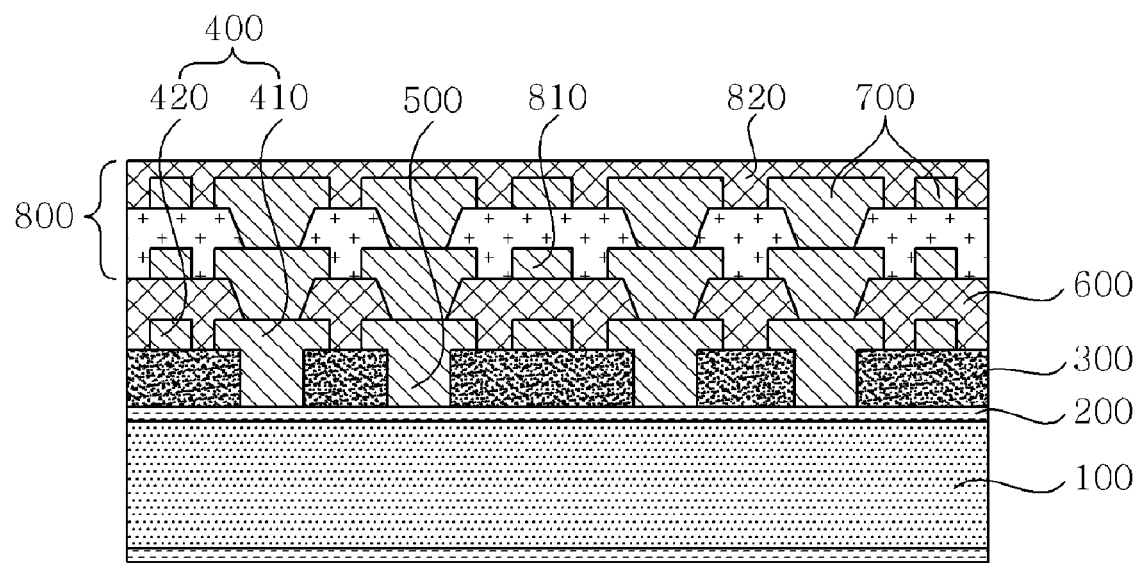

Next, as shown in FIGS. 14 and 15, a step of forming the buildup layer 800 including a lower circuit layer 700 on the insulating layer 600 is conducted.

Figure 16:
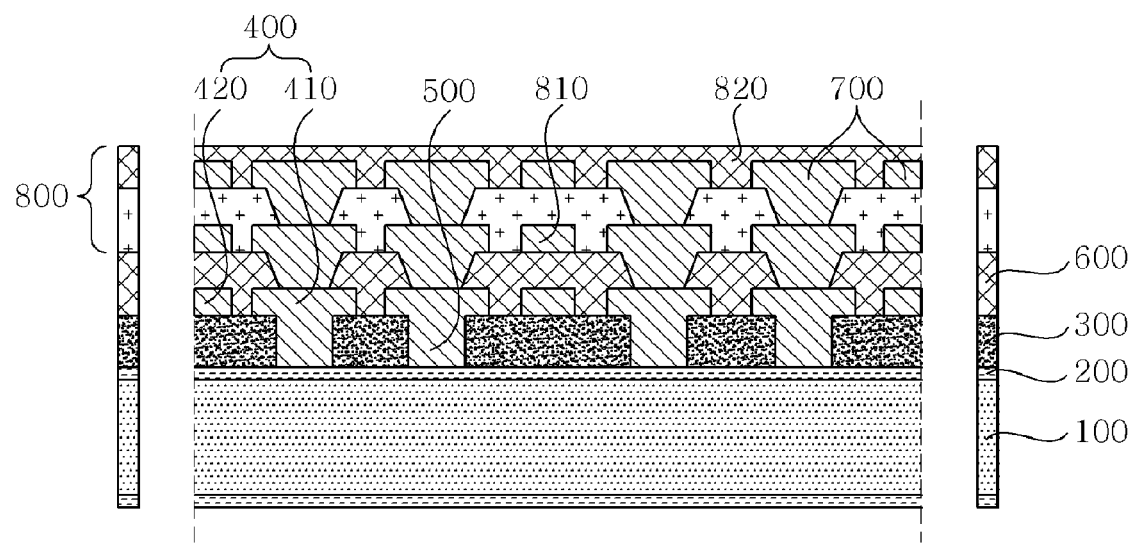

Subsequently, as shown in FIG. 16, a step of removing the carrier 100 is performed. By applying mechanical impact to the carrier 100 or exposing the carrier 100 to heat of a preset temperature or higher, the adhesive force is reduced, so that the metal foil 200 can be separated from the carrier 100. However, the metal foil 200 may be separated from the carrier 100 by impact and vibration through a routing process (see FIG. 16), instead of the separating method using direct mechanical impact or heat.

Figure 17:
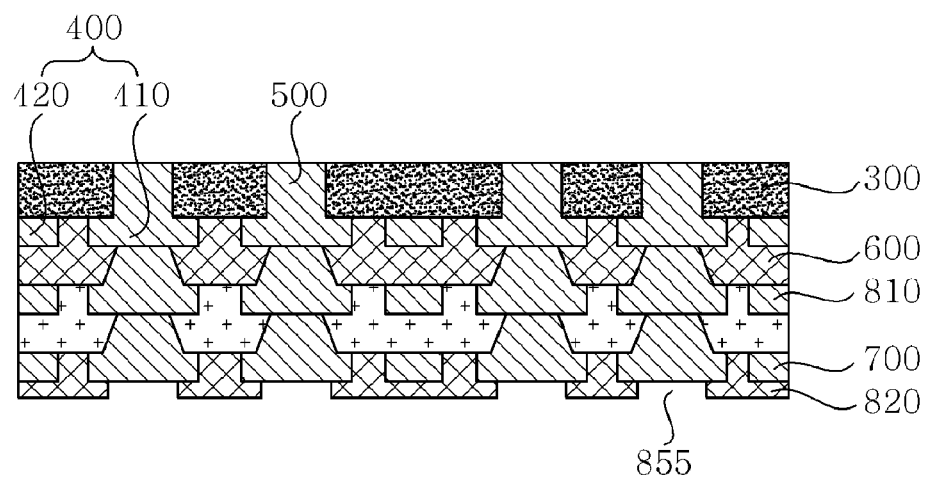

Next, as shown in FIG. 17, openings 855 are formed in a solder resist layer 820 to expose lower metal bumps formed on a lower circuit layer 700.

Figure 18:
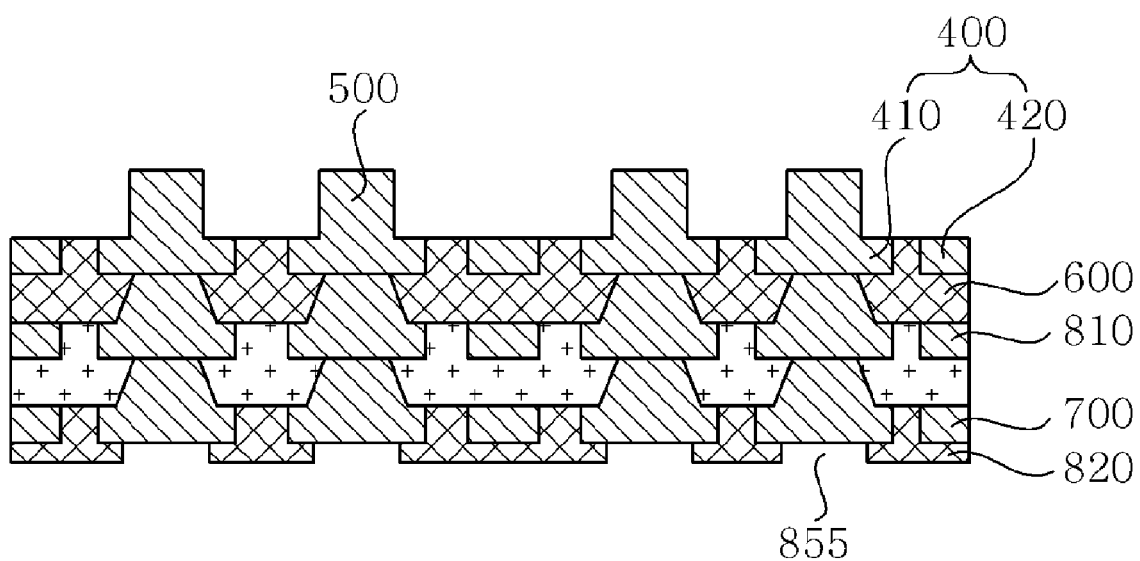

Subsequently, as shown in FIG. 18, the metal foil 200 is removed using stripping liquid.

As described above, the present invention provides a method of manufacturing a printed circuit board, in which a dry film is placed on a carrier and metal bumps are formed using the dry film, thus realizing the printed circuit board having the metal bumps of a post shape which have uniform height and good electrical transmission properties.

Further, the present invention is advantageous in that metal bumps are formed by charging holes of uniform diameter formed in a dry film through plating, so that the metal bumps of uniform diameter may be formed, and thus the bumps may be formed at fine pitch.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A method of manufacturing a printed circuit board having a metal bump, comprising:
   (A) placing a metal foil on a carrier;
   (B) applying a dry film and patterning a hole in the dry film but not the metal foil;
   (C) forming a metal bump in the hole on the metal film and forming an upper circuit layer including a connecting pad on the dry film;
   (D) forming an insulating layer on the dry film;
   (E) forming a buildup layer including a lower circuit layer on the insulating layer;
   (F) removing the carrier; and
   (G) removing the dry film.

2. The method as set forth in claim 1, wherein a polymer-based release layer is applied to each of opposite sides of a rigid substrate of the carrier.

3. The method as set forth in claim 1, wherein the carrier is made of a polymer-based release material.

4. The method as set forth in claim 1, wherein the metal foil is made of nickel (Ni) or aluminum (Al).

5. The method as set forth in claim 1, wherein forming the metal bump comprises:
   electrolytic plating the metal foil.

6. The method as set forth in claim 1, wherein the insulating layer comprises prepreg or a build-up film.

7. The method as set forth in claim 1, further comprising, after (E) forming the buildup layer, forming a solder resist layer on the lower circuit layer.

8. The method as set forth in claim 1, wherein (F) removing the carrier comprises:
   (i) separating the metal foil from the carrier; and
   (ii) removing the metal foil from the dry film.

* * * * *